United States Patent [19]

Sorrells et al.

[11] Patent Number: 5,281,874
[45] Date of Patent: Jan. 25, 1994

[54] COMPENSATED DIGITAL DELAY SEMICONDUCTOR DEVICE WITH SELECTABLE OUTPUT TAPS AND METHOD THEREFOR

[75] Inventors: Peter H. Sorrells, Chandler; Ned D. Garinger, Tempe, both of Ariz.

[73] Assignee: VLSI Technology, Inc., San Jose, Calif.

[21] Appl. No.: 836,078

[22] Filed: Feb. 14, 1992

[51] Int. Cl.$^5$ .............................................. H03K 5/13
[52] U.S. Cl. .................................. 307/606; 307/603; 328/55
[58] Field of Search ................ 307/594, 597, 480–481, 307/603, 605, 606; 328/55, 56

[56] References Cited

U.S. PATENT DOCUMENTS

| | | | |
|---|---|---|---|
| 4,119,796 | 8/1978 | Jones | 328/56 |
| 4,868,430 | 9/1989 | Stewart | 328/55 |
| 4,922,141 | 5/1990 | Lofgren | 328/55 |
| 4,965,815 | 10/1990 | Boudewijns | 328/55 |
| 5,087,842 | 2/1992 | Pulsipher | 307/606 |
| 5,111,086 | 5/1992 | Back | 328/55 |

Primary Examiner—Edward P. Westin
Assistant Examiner—Andrew Sanders
Attorney, Agent, or Firm—Harry M. Weiss

[57] ABSTRACT

A compensated digital delay semiconductor device is disclosed which uses two identical chains of delay elements. The first chain is the Reference Chain, which is driven by a crystal-controlled digital clock input. The second chain is the Input Signal Delay Chain, which is the delay path for the signal of interest. These two chains are located in physical proximity on the semiconductor die so that variations in the manufacturing process, temperature and power supply affect each chain the same. Circuitry monitors the delay performance of the Reference Chain, and dynamically changes the output tap of the Input Signal Delay Chain when a change in performance is detected on the Reference Chain, thereby compensating the delay of the device. This approach provides precise delays which are constant.

6 Claims, 1 Drawing Sheet

COMPENSATED DIGITAL DELAY SEMICONDUCTOR DEVICE WITH SELECTABLE OUTPUT TAPS AND METHOD THEREFOR

FIELD OF THE INVENTION

This invention generally relates to semiconductor devices and methods, and more specifically relates to a digital delay semiconductor device with selectable output taps and method therefor which provide several precise delays of the digital input signal, any one of which can be selected by choosing the appropriate output tap on the device. This device includes compensation to correct for variations in manufacturing process, temperature and power supply variations such that the delay from digital input signal to the selected output tap remains constant within a relatively tight tolerance.

DESCRIPTION OF THE PRIOR ART

The prior art provided various types of digital delay semiconductor devices and methods for providing the needed delays to satisfy timing parameters in a digital electronic system. One example of a system that requires specific delays is the control circuitry for dynamic Random Access Memory (DRAM) devices. The problem with the prior art devices is that the delay from input to output can vary considerably with variations in manufacturing process, operating temperature and power supply voltage. This problem was generally solved by designing the system architecture to eliminate the need for precise and constant delays, which generally resulted in a reduction of performance and flexibility of the system. Therefore, there existed a need to provide a digital delay semiconductor device with selectable output taps which is compensated such that each output is held relatively constant with respect to variations in the manufacturing process, temperature and power supply voltage.

SUMMARY OF THE INVENTION

It is an object of this invention to provide a digital delay semiconductor device with selectable output taps and method therefor which provides a plurality of output delays with respect to the digital input signal.

It is another object of this invention to provide a digital delay semiconductor device with selectable output taps and method therefor which includes compensation for holding the output delays relatively constant with respect to variations in the manufacturing process, temperature and power supply voltage.

It is a further object of this invention to provide a compensated digital delay semiconductor device with selectable output taps and method therefor which uses a compensation scheme that changes the configuration of the device in real-time to assure relatively constant delays on the output taps with respect to variations in the manufacturing process, temperature and power supply voltage.

According to the present invention, a digital delay semiconductor device is provided. This device has two parallel chains of delay elements that are adjacent on the semiconductor die such that effects induced by variations in the manufacturing process, temperature and power supply voltage will affect both chains of delay elements in the same manner. The first chain is a Reference Chain which has a crystal-controlled digital clock signal as the input. Various delay-element outputs of the reference delay chain, selected in a logarithmic spread across the length of the reference chain, are latched by monitor latches, the outputs of which provide inputs to a Combinatorial Logic/Enable Multiplexer (MUX). The output of the Combinatorial Logic/Enable MUX drives the tap enable gates on the tap outputs of the device. The combination of signals on the tap enable gates determines the selection and routing of signals from the input delay chain to the appropriate output tap.

As conditions such as temperature or power supply voltage vary, the two parallel chains of delay elements are effected in the same manner. If the reference crystal-controlled clock signal "drops out" at one or more stages of the reference delay chain (meaning that the pulse has not reached the input of the delay element before the next rising edge of the clock signal), the monitor latches will detect this change, and will dynamically change in real-time the tap enable lines driven by the Combinatorial Logic/Enable MUX such that the delay to the output tap remains constant within $+/-1$ delay unit.

The foregoing and other objects, features and advantages will be apparent from the following description of the preferred embodiment of the invention as illustrated in the accompanying drawings.

DESCRIPTION OF THE PREFERRED EMBODIMENT

Figure 1:
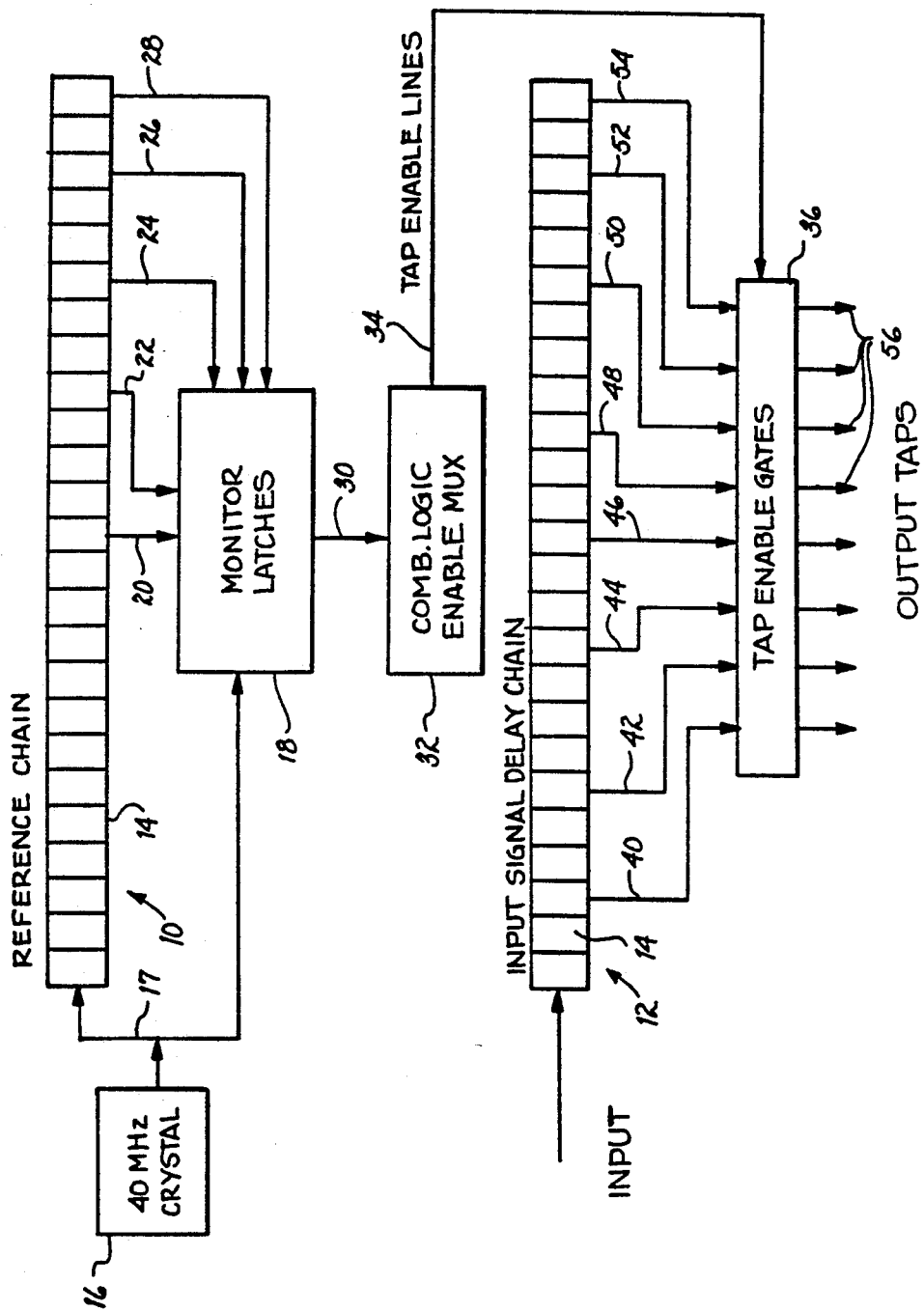
FIG. 1 is a block diagram of the compensated digital delay semiconductor device with selectable output taps of the present invention.

Referring to FIG. 1, two identical chains of delay elements are provided, a Reference Chain 10 and an Input Signal Delay Chain 12. The Reference Chain 10 and the Input Signal Delay Chain 12 are located adjacent on the semiconductor die such that variations in the manufacturing process, temperature or power supply voltage will affect both chains in the same manner. Each of these chains is comprised of a series of identical delay elements 14, with the output of each state driving the input of the successive stage. The delay provided by each delay element 14 in this specific implementation shown is one nanosecond (ns). A 40 MHz crystal 16 is provided to give a precise, crystal-controlled digital clock input 17 to the reference chain 10. The 40 MHz crystal 16 also provides the clocking signal for the monitor latches 18 which monitor various outputs 20, 22, 24, 26, and 28 of Reference Chain 10. The outputs 30 of monitor latches 18 are used as inputs to the Combinatorial Logic/Enable MUX 32 as shown. The outputs 34 of the Combinatorial Logic/Enable MUX 32 are the tap enable lines which control the appropriate tap enable gates 36 to route the outputs 40, 42, 44, 46, 48, 50, 52, and 54 of Input Signal Delay Chain 12 to the appropriate output taps 56.

OPERATION

The 40 MHz crystal 16 provides a precise, crystal-controlled digital clock input 17 to Reference Chain 10. This 40 MHz square wave has a period of 25 ns and a duty cycle of about 50%, which gives a half period of 12.5 ns. The Reference Chain 10 starts out in a reset condition, with the output of all delay elements 14 in the low state. When the 40 MHz clock input makes a low-to-high transition, this high logic level begins to propagate through the Reference Chain 10. With a nominal delay of one ns per delay element 14, the 12.5 ns high period propagates through nominally twelve of the delay elements 14 before the digital clock input 17 changes to the low state. At this point the logical low on the digital clock input 17 begins to propagate through the first stages of Reference Chain 10 as the high state continues to propagate to the later stages of Reference Chain 10. Notice that the chain is comprised of 25 delay elements 14, which will provide for 25 ns of delay, equivalent to a full clock period of the digital clock input 17. However, manufacturing process variations and changes in temperature and power supply voltage can cause the delay of each delay element 14 to vary in magnitude to be slightly more or less than the one ns nominal value resulting in a larger change in magnitude of the 25 ns nominal value.

The monitor latches 18 latch the appropriate stages of Reference Chain 10 on the rising edge of the digital clock input 17. The monitor latches will therefore detect a condition when the delay of each delay element 14 is more or less than the one ns nominal value. If the delay per delay element 14 becomes too long, one or more of the last delay elements will "drop out", meaning that they will not see the input signal go high prior to the next rising edge of the input clock signal. This information is reflected on the output 30 of the monitor latches 18, which dynamically cause the Combinatorial Logic/Enable MUX 32 to change state. This change of state causes a different output of the Input Signal Delay Chain 12 to be enabled to the appropriate output tap 56, maintaining an input-to-output delay that is constant within +/−1 ns of the specified value. In this manner the device is compensated to change its internal configuration dynamically as the environment requires, to keep the input-to-output delays for each output tap 56 within one delay element of the specified value.

Both the Reference Chain 10 and the Input Signal Delay Chain 12 are nominally reset such that the outputs of all delay elements 14 are placed in the logical low state at the end of each full clock period of the digital input signal.

While the invention has been described in its preferred embodiment, it is to be understood that the words which have been used are words of description rather than limitation, and that changes may be made within the purview of the appended claims without departing from the true scope and spirit of the invention in its broader aspects. For example, the 40 MHz crystal clock frequency could be substituted by crystals of many different speeds without departing from the scope of this invention. Likewise, the one ns per delay element 14 is given as an example for illustrative purposes, and could be much smaller or larger as the particular application requires. In addition the number of delay elements can be more or less than 25 as the particular application requires.

I claim:

1. A compensated digital delay semiconductor device comprising, in combination:
   first delay chain means having a plurality of delay elements for providing a defined delay from input to output, each of said delay elements having an output connected to an input of the successive delay element in serial fashion;
   crystal-controlled oscillator means for providing an oscillating digital input to the first of said delay elements of said first delay chain means, said digital input being substantially a square wave having a nominal duty cycle of about fifty percent;
   latch means coupled to a plurality of the outputs of said delay elements in said first delay chain means for latching the output state of said outputs of said delay elements in said first delay chain means;
   combinatorial logic and multiplexer means coupled to said latch means for translating the information on outputs of said latch means to a different form on a plurality of tap enable lines, each output of said latch means being fed directly into said combinatorial logic and multiplexer means;
   second delay chain means having delay elements identical in number to said delay elements of said first delay chain means, having an input coupled to a digital signal to be delayed, and physically located adjacent to said first delay chain means on a semiconductor die for permitting variations that affect said first delay chain means to also affect said second delay chain means in the same manner;
   tap enable gate means coupled to a plurality of outputs of said delay elements in said second delay chain means for routing and enabling said outputs of said delay elements in said second delay chain means, said tap enable gate means are coupled to said tap enable lines of said combinatorial logic and multiplexer means such that said tap enable liens control said routing and said enabling; and
   output taps coupled to said tap enable gate means and comprising a plurality of external output tap connections, each having a different total delay from aid input of said second delay chain means to each of said external output tap connections.

2. The device of claim 1 wherein said latch means having said oscillating digital input from said crystal-controlled oscillator means as a clock input, said clock input causing digital logic information on an input of said latch means to be transferred to an output of said latch means when said clock input makes a low-to-high transition in logic level.

3. The device of claim 1 wherein a change in delay of said first delay chain means is of greater magnitude than the delay of one of said delay elements resulting in said latch means latching different data which results in said combinatorial logic and multiplexer means driving a different combination on said tap enable lines thereby changing the output configuration of said tap enable gates such that the total delay from said input of said second delay chain means to any of said output taps remains constant within the magnitude of one delay of one of said delay elements, thereby compensating the delay of said digital signal to be delayed.

4. A method for providing a compensated digital delay semiconductor device comprising the steps of:
   providing first delay chain means having a plurality of delay elements for providing a defined delay from input to output, each of said delay elements having an output connected to an input of the successive delay element in serial fashion;
   providing crystal-controlled oscillator means for providing an oscillating digital input to the first of said delay elements of said first delay chain means, said digital input being substantially a square wave having a nominal duty cycle of about fifty percent;
   providing latch means coupled to a plurality of the outputs of said delay elements in said first delay chain means for latching the output state of said outputs of said delay elements in said first delay chain means;

providing combinatorial logic and multiplexer means coupled to said latch means for translating the information on outputs of said latch means to a different form on a plurality of tap enable lines, each output of said latch means being fed directly into said combinatorial logic and multiplexer means;

providing second delay chain means having delay elements identical in number to said delay elements of said first delay chain means, having an input coupled to a digital signal to be delayed, and physically located adjacent to said first delay chain means on a semiconductor die for permitting variations that affect said first delay chain means to also affect said second delay chain means in the same manner;

providing tap enable gate means coupled to a plurality of outputs of said delay elements in said second delay chain means for routing and enabling said outputs of said delay elements in said second delay chain means, said tap enable gate means are coupled to said tap enable lines of said combinatorial logic and multiplexer means such that said tap enable lines control said routing and said enabling; and providing output taps coupled to said tap enable gate means and comprising a plurality of external output tap connections, each having a different total delay from said input of said second delay chain means to each of said external output tap connections.

5. The method of claim 4 wherein said latch means having said oscillating digital input from said crystal-controlled oscillator means as a clock input, said clock input causing digital logic information on an input of said latch means to be transferred to an output of said latch means when said clock input makes a low-to-high transition in logic level.

6. The method of claim 4 wherein a change in delay of said first delay chain means is of greater magnitude than the delay of one of said delay elements resulting in said latch means latching different data which results in said combinatorial logic and multiplexer means driving a different combination on said tap enable lines thereby changing the output configuration of said tap enable gates such that the total delay from said input of said second delay chain means to any of said output taps remains constant within the magnitude of one delay of one of said delay elements, thereby compensating the delay of said digital signal to be delayed.

* * * * *